(12) United States Patent
Song

(10) Patent No.: US 9,007,849 B2
(45) Date of Patent: Apr. 14, 2015

(54) BUFFER CONTROL CIRCUIT OF SEMICONDUCTOR MEMORY APPARATUS

(71) Applicant: SK Hynix Inc., Icheon-si, Gyeonggi-do (KR)

(72) Inventor: Choung Ki Song, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/707,776

(22) Filed: Dec. 7, 2012

(65) Prior Publication Data
US 2013/0318321 A1    Nov. 28, 2013

(30) Foreign Application Priority Data
May 25, 2012  (KR) .................. 10-2012-0056012

(51) Int. Cl.
*G11C 7/10*     (2006.01)
*G06F 13/16*    (2006.01)

(52) U.S. Cl.
CPC .................... *G06F 13/1689* (2013.01)

(58) Field of Classification Search
USPC ............................. 365/194, 189.05
See application file for complete search history.

(56) References Cited

U.S. PATENT DOCUMENTS

| 2004/0015803 A1* | 1/2004 | Huang et al. ............... 716/10 |
| 2007/0115751 A1* | 5/2007 | Kim et al. ................ 365/233 |
| 2010/0008169 A1* | 1/2010 | Kim et al. ................ 365/194 |
| 2010/0049911 A1* | 2/2010 | Kim ...................... 711/105 |

* cited by examiner

*Primary Examiner* — Anthan Tran
(74) *Attorney, Agent, or Firm* — William Park & Associates Patent Ltd.

(57) ABSTRACT

A buffer control circuit of a semiconductor memory apparatus includes a delay unit configured to determine delay amounts for a command in response to a plurality of command latency signals, delay the command according to a clock, and generate a plurality of delayed signals; and a buffer control signal generation unit configured to receive the plurality of command latency signals and the plurality of delayed signals, and generate a buffer control signal.

20 Claims, 7 Drawing Sheets

BUFFER CONTROL CIRCUIT OF SEMICONDUCTOR MEMORY APPARATUS

CROSS-REFERENCES TO RELATED APPLICATION

The present application claims priority under 35 U.S.C. §119(a) to Korean application number 10-2012-0056012, filed on May 25, 2012, in the Korean Intellectual Property Office, which is incorporated herein by reference in its entirety.

BACKGROUND

1. Technical Field

The present invention generally relates to a semiconductor integrated circuit, and more particularly, to a buffer control circuit of a semiconductor memory apparatus.

2. Related Art

In a semiconductor memory apparatus, a write command is inputted in a write operation, and data (i.e., see FIG. 1C, DQ) is inputted to a buffer in synchronization with the write command. The buffer is not always turned on but is on/off controlled to reduce current consumption. The on/off control of the buffer is implemented by a buffer control signal.

In detail, a conventional buffer control signal will be described below with reference to FIGS. 1A, 1B and 1C.

FIG. 1A is a delay circuit of a conventional buffer control circuit, and FIG. 1B is a decoder of the conventional buffer control circuit. FIG. 1C is a timing diagram of a buffer control signal in the conventional buffer control circuit.

FIG. 1A shows a delay circuit of a conventional buffer control circuit, which includes a plurality of multiplexers and a plurality of flip-flops (i.e., F/F). The flip-flops F/F may receive a clock signal clk and a multiplexer may be coupled to a ground voltage Vss as shown in FIG. 1A. If a command cmd is inputted, the command cmd is delayed under the control of command latency signals cwl<7:10>, and first to fourteenth delayed signals L<1:14> are to generated.

The command cmd may be a write command. The time from after the write command is inputted to a semiconductor memory apparatus to until an operation is actually performed according to the write command is referred to as a CAS write latency (cwl). The CAS write latency (cwl) is prescribed in a specification to have a limited value according to an operation frequency.

FIG. 1B illustrates a decoder of the conventional buffer control circuit, which includes a plurality of logic circuits. The decoder receives the fifth to fourteenth delayed signals L<5:14> and generates a buffer control signal endinds.

Referring to FIG. 1B, the decoder receives the fifth to fourteenth delayed signals L<5:14> which are sequentially generated by the delay circuit, and generates the buffer control signal endinds.

Accordingly, the buffer control signal endinds is generated from when the fifth delayed signal L5 is enabled and is retained until the fourteenth delayed signal L14 is disabled.

The timing of the buffer control signal endinds will be described with reference to FIGS. 1A, 1B, and 1C.

First, the case where a CAS (i.e., column address strobe) write latency value is 9 will be described.

In FIG. 1A, the delay circuit sequentially delays the command cmd (i.e., see FIG. 1C, WT write command) according to a control signal cwl9.

In FIG. 1B, the decoder receives the fifth to fourteenth delayed signals L<5:14> among the commands cmd delayed according to the control of the control signal cwl9, and generates the buffer control signal endinds.

In detail, comparing delay amounts in the delay circuit of FIG. 1A, the fifth delayed signal L5 is generated when the command cmd controlled by the control signal cwl9 is delayed by 4 cycles (4*tCK), and the tenth delayed signal L10 is generated when the command cmd controlled by the control signal cwl9 is delayed by 9 cycles (9*tCK).

The decoder of FIG. 1B receives the fifth delayed signal L5 and generates the buffer control signal endinds. Accordingly, when 4 cycles (4*tCK) elapse after the command cmd is inputted, the buffer control signal endinds is generated.

The control signal cwl9 is a signal which actually executes a command when 9 cycles (9*tCK) elapse after the command cmd is inputted. In the delay circuit of FIG. 1A, the tenth delayed signal L10 is generated when 9 cycles (9*tCK) elapse after the command cmd is inputted.

Accordingly, a command is actually executed after 5 cycles (5*tCK) from when the buffer control signal endinds is enabled (see FIG. 1C, cwl=9).

Next, the case where a CAS write latency value is 7 will be described.

In FIG. 1A, the delay circuit sequentially delays the command cmd (i.e., see FIG. 1C, WT write command) according to a control signal cwl7.

In FIG. 1B, the decoder receives the fifth to fourteenth delayed signals L<5:14> among the commands cmd delayed according to the control of the control signal cwl7, and generates the buffer control signal endinds.

In detail, comparing delay amounts in the delay circuit of FIG. 1A, the fifth delayed signal L5 is generated when the command cmd controlled by the control signal cwl7 is delayed by 2 cycles (2*tCK), and the tenth delayed signal L10 is generated when the command cmd controlled by the control signal cwl7 is delayed by 7 cycles (7*tCK).

The decoder of FIG. 1B receives the fifth delayed signal L5 and generates the buffer control signal endinds. Accordingly, when 2 cycles (2*tCK) elapse after the command cmd is inputted, the buffer control signal endinds is generated.

The control signal cwl7 is a signal which actually executes a command when 7 cycles (7*tCK) elapse after the command cmd is inputted. In the delay circuit of FIG. 1A, the tenth delayed signal L10 is generated when 7 cycles (7*tCK) elapse after the command cmd is inputted.

Accordingly, a command is actually executed after 5 cycles (5*tCK) from when the buffer control signal endinds is enabled (see FIG. 1C, cwl=7).

In this way, in the conventional art, since the pulse width of the buffer control signal endinds is fixed, a problem is caused in that unnecessary current consumption is caused.

SUMMARY

In an embodiment, a buffer control circuit of a semiconductor memory apparatus includes: a delay unit configured to is determine delay amounts for a command in response to a plurality of command latency signals, delay the command according to a clock, and generate a plurality of delayed signals; and a buffer control signal generation unit configured to receive the plurality of command latency signals and the plurality of delayed signals, and generate a buffer control signal.

In an embodiment, a buffer control circuit of a semiconductor memory apparatus includes: a delay unit configured to determine delay amounts for a command in response to a plurality of command latency signals, delay the command according to a clock, and generate a plurality of delayed signals; and a buffer control signal generation unit configured to select an pulse width of a buffer control signal in response to the plurality of command latency signals, and generate the buffer control signal by combining the plurality of delayed signals, and output the buffer control signal. The buffer control signal generation unit includes: a buffer control signal period selecting section configured to select a delayed signal among the plurality of delayed signals in response to the command latency signals, and determine a period through which the buffer control signal is to be enabled; and a buffer control signal combining section configured to combine the selected delayed signal and the plurality of delayed signals and generate the buffer control signal.

BRIEF DESCRIPTION OF THE DRAWINGS

Features, aspects, and embodiments are described in is conjunction with the attached drawings, in which.

DETAILED DESCRIPTION

Hereinafter, a buffer control circuit of a semiconductor is memory apparatus according to various embodiments will be described below with reference to the accompanying drawings through the various embodiments.

Figure 2:
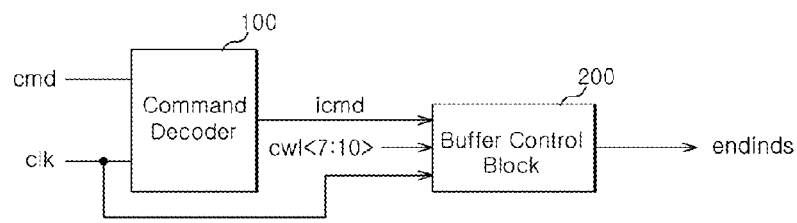
FIG. 2 is a block diagram of a buffer control circuit of a semiconductor memory apparatus in accordance with an embodiment.

FIG. 2 is a block diagram of a buffer control circuit of a semiconductor memory apparatus in accordance with an embodiment. Referring to FIG. 2, a buffer control circuit of a semiconductor memory apparatus may include a command decoder 100 and a buffer control block 200.

The command decoder 100 may be configured to decode a command cmd in response to a clock clk. That is to say, the command decoder 100 decodes the command cmd and may output an internal command icmd. The internal command icmd indicates control signals which are received at levels capable of being represented by a CAS read command casrd or a CAS write command caswt.

The buffer control block 200 may be configured to receive the clock clk, the internal command icmd and command latency signals cwl<7:10>, and generate a buffer control signal endnds.

If a command is inputted to a semiconductor memory apparatus, an operation is actually performed according to the command after a predetermined time. The time from after a command is inputted to a semiconductor memory apparatus to until an operation is actually performed according to the command is referred to as a latency. Command latency values according to respective commands may be set in advance.

In an embodiment, the internal command icmd may be a write command caswt, and the time from after the write command caswt is inputted to the semiconductor memory apparatus to until an operation is actually performed according to the write command caswt is referred to as a CAS write latency (cwl). The CAS write latency (cwl) is prescribed in a specification to have a limited value according to an operation frequency.

The buffer control block 200 receives the internal command icmd outputted from the command decoder 100, sequentially delays the internal command icmd according to the clock clk, and may generate a plurality of delayed signals. The buffer control block 200 controls the delay amounts of the plurality of delayed signals according to the command latency signals cwl<7:10>.

The buffer control block 200 enables the plurality of delayed signals from times at which the command latency signals cwl<7:10> are enabled.

The buffer control block 200 may generate the buffer control signal endnds by combining the plurality of delayed signals and the command latency signals cwl<7:10>.

Figure 3:
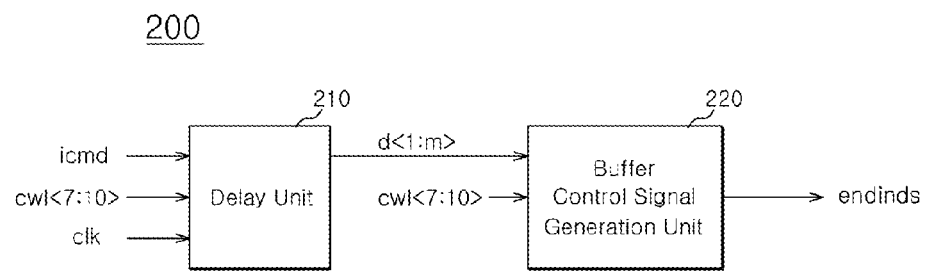
FIG. 3 is a block diagram of the buffer control block of the buffer control circuit in accordance with an embodiment.

FIG. 3 is a block diagram of the buffer control block 200 of the buffer control circuit in accordance with an embodiment.

Referring to FIG. 3, the buffer control block 200 may include a delay unit 210 and a buffer control signal generation unit 220.

The delay unit 210 may be configured to receive the clock clk, the internal command icmd and the command latency signals cwl<7:10> and generate a plurality of delayed signals d<1:m> (m is a natural number). The internal command icmd indicates control signals which are received at levels capable of being represented by a CAS read command casrd or a CAS write command caswt.

The delay unit 210 sequentially delays the internal command icmd according to the clock clk and may generate the plurality of delayed signals d<1:m>. The delay amounts of the plurality of delayed signals d<1:m> are controlled by the command latency signals cwl<7:10>.

The buffer control signal generation unit 220 may be configured to combine the plurality of delayed signals d<1:m> and the command latency signals cwl<7:10> and generate the buffer control signal endnds.

The buffer control signal endnds is determined in the pulse width thereof according to the command latency signals cwl<7:10>.

Figure 4:
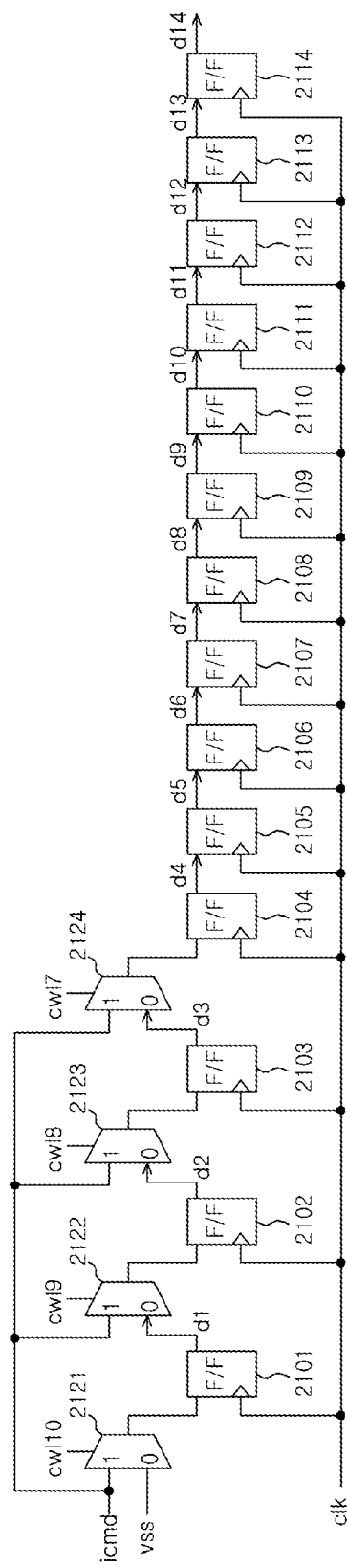
FIG. 4 is a circuit diagram of the delay unit of the buffer control circuit in accordance with an embodiment.

FIG. 4 is a circuit diagram of the delay unit 210 of the buffer control circuit in accordance with an embodiment.

The delay unit 210 may include first to fourteenth delay elements 2101, 2102, 2103, . . . and 2114 (i.e., flip-flops F/F) and first to fourth multiplexers 2121, 2122, 2123 and 2124.

The first multiplexer 2121 may output the internal command icmd when the first command latency signal cwl10 is enabled. The first multiplexer 2121 may output a ground voltage vss when the first command latency signal cwl10 is not enabled.

The first delay element 2101 may delay the internal is command icmd in response to the clock clk and may generate the first delayed signal d1.

The second multiplexer 2122 may output the internal command icmd when the second command latency signal cwl9 is enabled. The second multiplexer 2122 may output the first delayed signal d1 when the second command latency signal cwl9 is not enabled.

The second delay element 2102 may delay the first delayed signal d1 in response to the clock clk and may generate the second delayed signal d2.

The third multiplexer 2123 may output the internal command icmd when the third command latency signal cwl8 is enabled. The third multiplexer 2123 may output the second delayed signal d2 when the third command latency signal cwl8 is not enabled.

The third delay element 2103 may delay the second delayed signal d2 in response to the clock clk and may generate the third delayed signal d3.

The fourth multiplexer 2124 may output the internal command icmd when the fourth command latency signal cwl7 is enabled. The fourth multiplexer 2124 may output the third delayed signal d3 when the fourth command latency signal cwl7 is not enabled.

The fourth delay element 2104 may delay the third delayed signal d3 in response to the clock clk and may generate the fourth delayed signal d4.

The fifth delay element 2105 may delay the fourth delayed signal d4 in response to the clock clk and may generate the fifth delayed signal d5.

The sixth delay element 2106 may delay the fifth delayed signal d5 in response to the clock clk and may generate the sixth delayed signal d6.

The seventh delay element 2107 may delay the sixth delayed signal d6 in response to the clock clk and may generate the seventh delayed signal d7.

The eighth delay element 2108 may delay the seventh delayed signal d7 in response to the clock clk and may generate the eighth delayed signal d8.

The ninth delay element 2109 may delay the eighth delayed signal d8 in response to the clock clk and may generate the ninth delayed signal d9.

The tenth delay element 2110 may delay the ninth delayed signal d9 in response to the clock clk and may generate the tenth delayed signal d10.

The eleventh delay element 2111 may delay the tenth delayed signal d10 in response to the clock clk and may generate the eleventh delayed signal d11.

The twelfth delay element 2112 may delay the eleventh delayed signal d11 in response to the clock clk and may generate the twelfth delayed signal d12.

The thirteenth delay element 2113 may delay the twelfth is delayed signal d12 in response to the clock clk and may generate the thirteenth delayed signal d13.

The fourteenth delay element 2114 may delay the thirteenth delayed signal d13 in response to the clock clk and may generate the fourteenth delayed signal d14.

Figure 5:
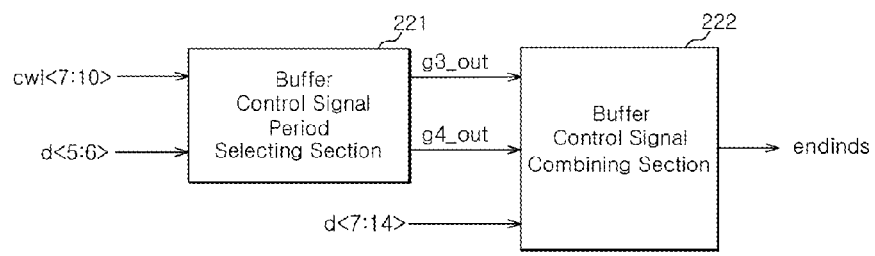
FIG. 5 is a block diagram of the buffer control signal generation unit of the buffer control circuit in accordance with an embodiment.

FIG. 5 is a block diagram of the buffer control signal generation unit 220 of the buffer control circuit in accordance with an embodiment.

Referring to FIG. 5, the buffer control signal generation unit 220 may include a buffer control signal period selecting section 221 and a buffer control signal generating section 222.

The buffer control signal period selecting section 221 may be configured to receive the first to fourth command latency signals cwl<7:10> and the fifth and sixth delayed signals d<5:6> and may output a first period select signal g3_out and a second period select signal g4_out.

The buffer control signal period selecting section 221 may output the first period select signal g3_out and then may output the second period select signal g4_out, when the first or second command latency signal cwl<9:10> is enabled.

The first period select signal g3_out of the buffer control signal period selecting section 221 is a signal which may be outputted at a high level (i.e., high voltage logic level) when the first or second command latency signal cwl<9:10> is enabled and the fifth delayed signal d5 is a high level.

In other words, the first period select signal g3_out of the buffer control signal period selecting section 221 is a signal which may be enabled when the first or second command latency signal cwl<9:10> is enabled and the fifth delayed signal d5 is enabled.

The buffer control signal period selecting section 221 may output the second period select signal g4_out when the third and fourth command latencies cwl<7:8> are enabled.

The second period select signal g4_out of the buffer control signal period selecting section 221 is a signal which may be outputted at a high level when any one signal of the first to fourth command latency signals cwl<7:10> is enabled and the sixth delayed signal d6 is a high level.

In other words, the second period select signal g4_out of the buffer control signal period selecting section 221 is a signal which may be enabled when any one signal of the first to fourth command latency signals cwl<7:10> is enabled and the sixth delayed signal d6 is enabled.

Figure 7:
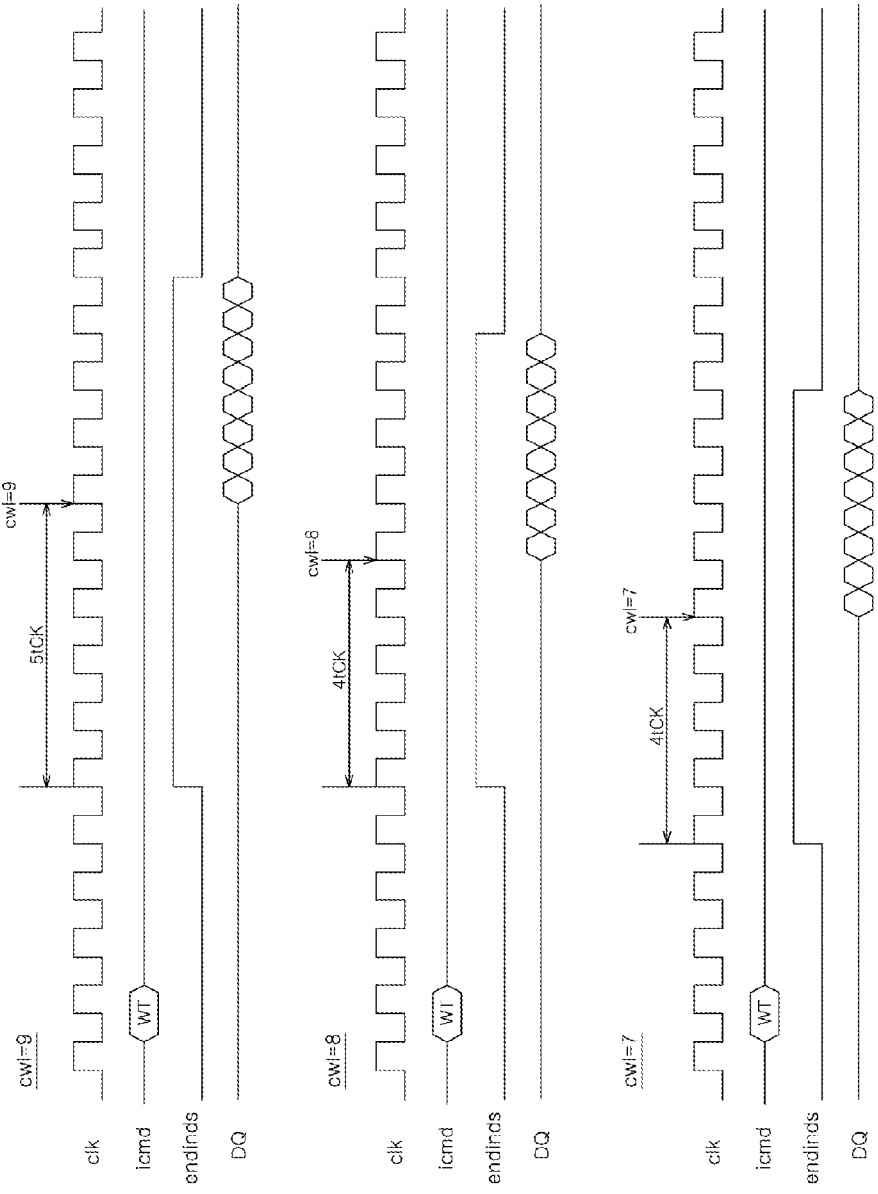
FIG. 7 is a timing diagram of a buffer control signal in the buffer control circuit in accordance with an embodiment.

FIG. 7 is a timing diagram of the buffer control signal endinds in the buffer control circuit in accordance with an embodiment. FIG. 7 also shows the internal command icmd signal with, for example, a write command WT.

Describing the buffer control signal period selecting section 221 of FIG. 5 with reference to FIGS. 4 and 7, timing at which data (i.e., DQ) is outputted to a buffer by the first to fourth command latency signals cwl<7:10> is the same as the enable timing of the tenth delayed signal d10.

If the buffer control signal period selecting section 221 outputs the first period select signal g3_out according to the first and second command latency signals cwl<9:10>, the buffer control signal endinds is enabled when the fifth delayed signal d5 is enabled. Namely, the buffer control signal endinds is enabled 5 cycles (5*tCK) (i.e., 5tCK) earlier than the timing at which the data (i.e., DQ) is inputted to the buffer.

In other words, if the buffer control signal period selecting section 221 outputs the first period select signal g3_out according to the first and second command latency signals cwl<9:10>, the buffer control signal endinds is inputted 5 cycles (5*tCK) earlier than the timing at which the data is inputted to the buffer by the first or second command latency signal cwl<9:10>.

Next, if the buffer control signal period selecting section 221 outputs the second period select signal g4_out according to the third and fourth command latency signals cwl<7:8>, the buffer control signal endinds is enabled when the sixth delayed signal d6 is enabled. Namely, the buffer control signal endinds is enabled 4 cycles (4*tCK) (i.e., 4tCK) earlier than the timing at which the data (i.e., DQ) is inputted to the buffer.

In other words, if the buffer control signal period selecting section 221 outputs the second period select signal g4_out according to the third and fourth command latency signals cwl<7:8>, the buffer control signal endinds is inputted 4 cycles (4*tCK) earlier than the timing at which the data is inputted to the buffer by the third or fourth command latency signal cwl<7:8>.

However, while the second period select signal g4_out of the buffer control signal period selecting section 221 is outputted if the sixth delayed signal d6 is enabled when the first and second command latency signals cwl<7:8> are inputted, the first period select signal g3_out of the buffer control signal period selecting section 221 is not outputted when the third and fourth command latency signals cwl<9:10> are inputted.

The buffer control signal generating section 222 may be configured to combine the first and second period select signals g3_out and g4_out and the sequentially enabled seventh to fourteenth delayed signals d<7:14> and generate the buffer control signal endinds, when the buffer control signal period selecting section 221 selects the pulse width of the buffer control signal endinds.

Figure 6:
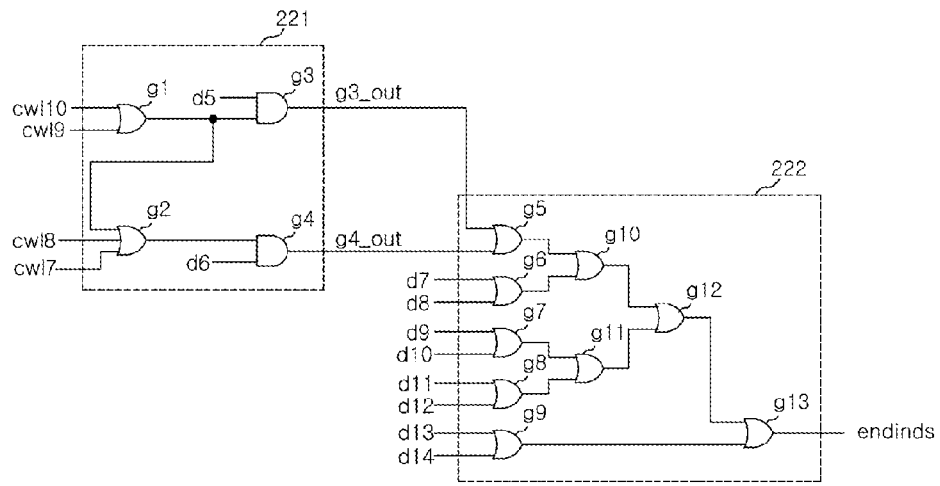
FIG. 6 is a circuit diagram of the buffer control signal generation unit of the buffer control circuit in accordance with an embodiment.

FIG. 6 is a circuit diagram of the buffer control signal generation unit 220 of the buffer control circuit in accordance with an embodiment.

The buffer control signal generation unit 220 in accordance with an embodiment may include a buffer control signal period selecting section 221, a buffer control signal combining section 222, and a plurality of logic circuits.

A first logic circuit g1, a second logic circuit g2, and fifth to thirteenth logic circuits g5, g6, g7, g8, g9, g10, g11, g12, and g13 are constituted by OR gates.

A third logic circuit g3 and a fourth logic circuit g4 are constituted by AND gates.

The buffer control signal generation unit 220 will be described with reference to FIGS. 4 and 6.

First, when the first command latency signal cwl10 and the second command latency signal cwl9 among the command latency signals cwl<7:10> are inputted to the first logic circuit g1, if the logic level of any one signal of the first command latency signal cwl10 and the second command latency signal cwl9 is high, a high value is inputted to the third logic circuit g3.

The third logic circuit g3 combines the logic level inputted from the first logic circuit g1 and the logic level of the fifth delayed signal d5. In the case where the logic level inputted from the first logic circuit g1 is high and the value of the fifth delayed signal d5 is high, the third logic circuit g3 inputs a high value to the fifth logic circuit g5. Referring to FIG. 4, after the logic level of the internal command icmd is inputted at a high level according to the first command latency signal cwl10 and is delayed by 5 cycles (5*tCK) by sequentially passing through the first delay element 2101 to fifth delay element 2105, the logic level of the fifth delayed signal d5 becomes high.

Also, after the logic level of the internal command icmd is inputted at a high level according to the second command latency signal cwl9 and is delayed by 4 cycles (4*tCK) by sequentially passing through the second delay element 2102 to fifth delay element 2105, the logic level of the fifth delayed signal d5 becomes high.

If the logic level of the fifth delayed signal d5 is inputted to the third logic circuit g3 at the high level, since the logic level inputted from the first logic circuit g1 is the high level, a high value is inputted to the fifth logic circuit g5.

Because the fifth logic circuit g5, the tenth logic circuit g10, the twelfth logic circuit g12 and the thirteenth logic circuit g13 are OR gates, at a time when the logic level of the fifth delayed signal d5 becomes high, the logic level of the buffer control signal endinds generated in the thirteenth logic circuit g13 becomes high as well.

The first logic circuit g1 may input a value acquired by performing an operation for the logic level of the first command latency signal cwl10 or the second command latency signal cwl9, to the second logic circuit g2. If the first command latency signal cwl10 or the second command latency signal cwl9 is high, the second logic circuit g2 inputs a high value to the fourth logic circuit g4. The fourth logic circuit g4 inputs a high value to the fifth logic circuit g5 when the sixth delayed signal d6 has a high value. The fifth logic circuit g5, the tenth logic circuit g10, the twelfth logic circuit g12 and the thirteenth logic circuit g13 sequentially receive the logic level of a high value and retain the buffer control signal endinds at a high value.

The seventh delayed signal d7 to the fourteenth delayed signal d14, which are delayed and sequentially have a high value, are inputted to the sixth logic circuit g6 to the ninth logic circuit g9, sequentially transfer a high value to the tenth logic circuit g10 to the thirteenth logic circuit g13, and retain the logic level of the buffer control signal endinds at the high value.

Next, the case where the third command latency signal cwl8 and the fourth command latency signal cwl7 among the command latency signals cwl<7:10> are inputted to the second logic circuit g2 will be described. If the logic level of any one signal of the third command latency signal cwl8 and the fourth command latency signal cwl7 is high, a high value is inputted to the fourth logic circuit g4.

The fourth logic circuit g4 combines the logic level inputted from the second logic circuit g2 and the logic level of the sixth delayed signal d6. In the case where the logic level inputted from the second logic circuit g2 is high and the value of the sixth delayed signal d6 is high, the fourth logic circuit g4 inputs a high value to the fifth logic circuit g5. Referring to FIG. 4, after the logic level of the internal command icmd is inputted at a high level according to the third command latency signal cwl8 and is delayed by 4 cycles (4*tCK) by sequentially passing through the third delay element 2103 to sixth delay element 2106, the logic level of the sixth delayed signal d6 becomes high.

Also, after the logic level of the internal command icmd is inputted at a high level according to the fourth command latency signal cwl7 and is delayed by 3 cycles (3*tCK) by sequentially passing through the fourth delay element 2104 to sixth delay element 2106, the logic level of the sixth delayed signal d6 becomes high. If the logic level of the sixth delayed signal d6 is inputted to the fourth logic circuit g4 at the high level, since the logic level inputted from the second logic circuit g2 is the high level, a high value is inputted to the fifth logic circuit g5.

Because the fifth logic circuit g5, the tenth logic circuit g10, the twelfth logic circuit g12 and the thirteenth logic circuit g13 are OR gates, at a time when the logic level of the fifth delayed signal d5 becomes high, the logic level of the buffer control signal endinds generated in the thirteenth logic circuit g13 becomes high as well.

The seventh delayed signal d7 to the fourteenth delayed signal d14, which are delayed and sequentially have a high value, are inputted to the sixth logic circuit g6 to the ninth logic circuit g9, sequentially transfer a high value to the tenth logic circuit g10 to the thirteenth logic circuit g13, and retain the logic level of the buffer control signal endinds at the high value.

In other words, the buffer control signal endinds is enabled 5 cycles (5*tCK) earlier than the time at which the data is inputted to the buffer by the first command latency signal cwl10 or the second command latency signal cwl9 among the command latency signals cwl<7:10>. That is to say, the buffer control signal endinds is enabled from the time at which the fifth delayed signal d5 is enabled.

Further, the buffer control signal endinds is enabled 4 cycles (4*tCK) earlier than the time at which the data is inputted to the buffer by the third command latency signal cwl8 or the fourth command latency signal cwl7 among the command latency signals cwl<7:10>. That is to say, the buffer control signal endinds is enabled from the time at which the sixth delayed signal d6 is enabled.

FIG. 7 is a timing diagram of the buffer control signal endinds in the buffer control circuit in accordance with an embodiment.

Explanations will be made with reference to FIG. 7. When the CAS write latency (cwl) is 9 (i.e., cwl=9), the buffer control signal endinds is enabled at the time at which the fifth delayed signal d5 is enabled. The data is inputted to the buffer 9 cycles (9*tCK) after the internal command icmd is inputted (i.e., write command WT). If the input of the data to the buffer is ended, the buffer control signal endinds is disabled.

The second command latency signal cwl9 is a signal which actually executes a command 9 cycles (9*tCK) after the internal command icmd is inputted. This time is the same as the time for which the internal command icmd controlled by the second command latency signal cwl9 is delayed sequentially nine times by passing through the second to tenth delay elements 2102 to 2110 in the delay unit 210 shown in FIG. 4. The signal passed through the tenth delay element 2110 is the tenth delayed signal d10. Therefore, if the buffer control signal endinds is enabled at the time at which the fifth delayed signal d5 is enabled, the buffer control signal endinds is enabled 5 cycles (5*tCK) (i.e., 5tCK) earlier than the tenth delayed signal d10.

When the CAS write latency (cwl) is 8 (i.e., cwl=8), the buffer control signal endinds is enabled at the time at which the sixth delayed signal d6 is enabled. The data is inputted to the buffer 8 cycles (8*tCK) after the internal command icmd is inputted (i.e., write command WT). If the input of the data to the buffer is ended, the buffer control signal endinds is disabled.

The third command latency signal cwl8 is a signal which actually executes a command 8 cycles (8*tCK) after the internal command icmd is inputted. This time is the same as the time for which the internal command icmd controlled by the third command latency signal cwl8 is delayed sequentially eight times by passing through the third to tenth delay elements 2103 to 2110 in the delay unit 210 shown in FIG. 4. The signal passed through the tenth delay element 2110 is the tenth delayed signal d10. Therefore, if the buffer control signal endinds is enabled at the time at which the sixth delayed signal d6 is enabled, the buffer control signal endinds is enabled 4 cycles (4*tCK) (i.e., 4tCK) earlier than the tenth delayed signal d10.

When the CAS write latency (cwl) is 7 (i.e., cwl=7), the buffer control signal endinds is enabled at the time at which the sixth delayed signal d6 is enabled. The data is inputted to the buffer 7 cycles (7*tCK) after the internal command icmd is inputted (i.e., write command WT). If the input of the data to the buffer is ended, the buffer control signal endinds is disabled.

The fourth command latency signal cwl7 is a signal which actually executes a command 7 cycles (7*tCK) after the internal is command icmd is inputted. This time is the same as the time for which the internal command icmd controlled by the fourth command latency signal cwl7 is delayed sequentially seven times by passing through the fourth to tenth delay elements 2104 to 2110 in the delay unit 210 shown in FIG. 4. The signal passed through the tenth delay element 2110 is the tenth delayed signal d10. Therefore, if the buffer control signal endinds is enabled at the time at which the sixth delayed signal d6 is enabled, the buffer control signal endinds is enabled 4 cycles (4*tCK) (i.e., 4tCK) earlier than the tenth delayed signal d10.

Figure 1A:
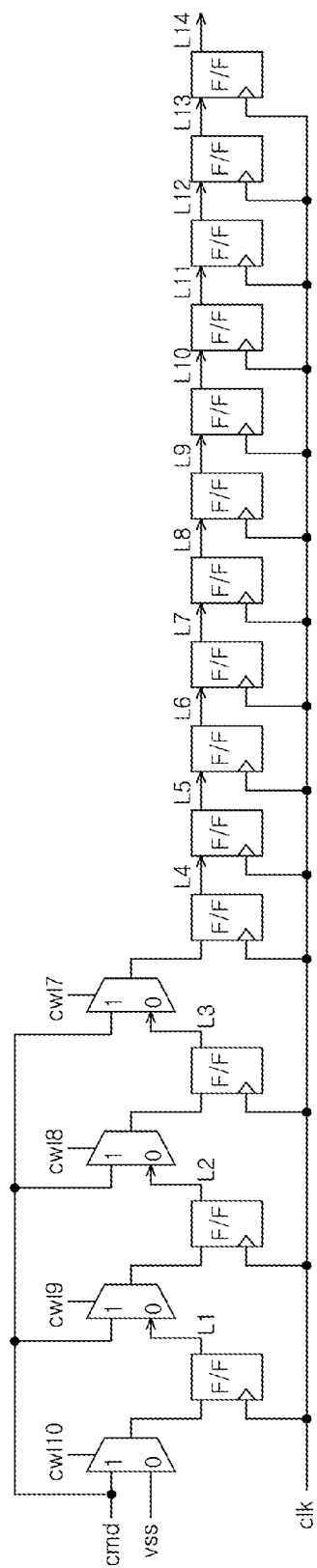
FIG. 1A is a delay circuit of a conventional buffer control circuit.
Figure 1B:
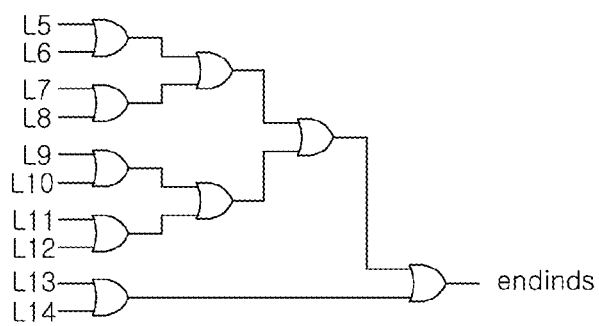
FIG. 1B is a decoder of the conventional buffer control circuit.
Figure 1C:
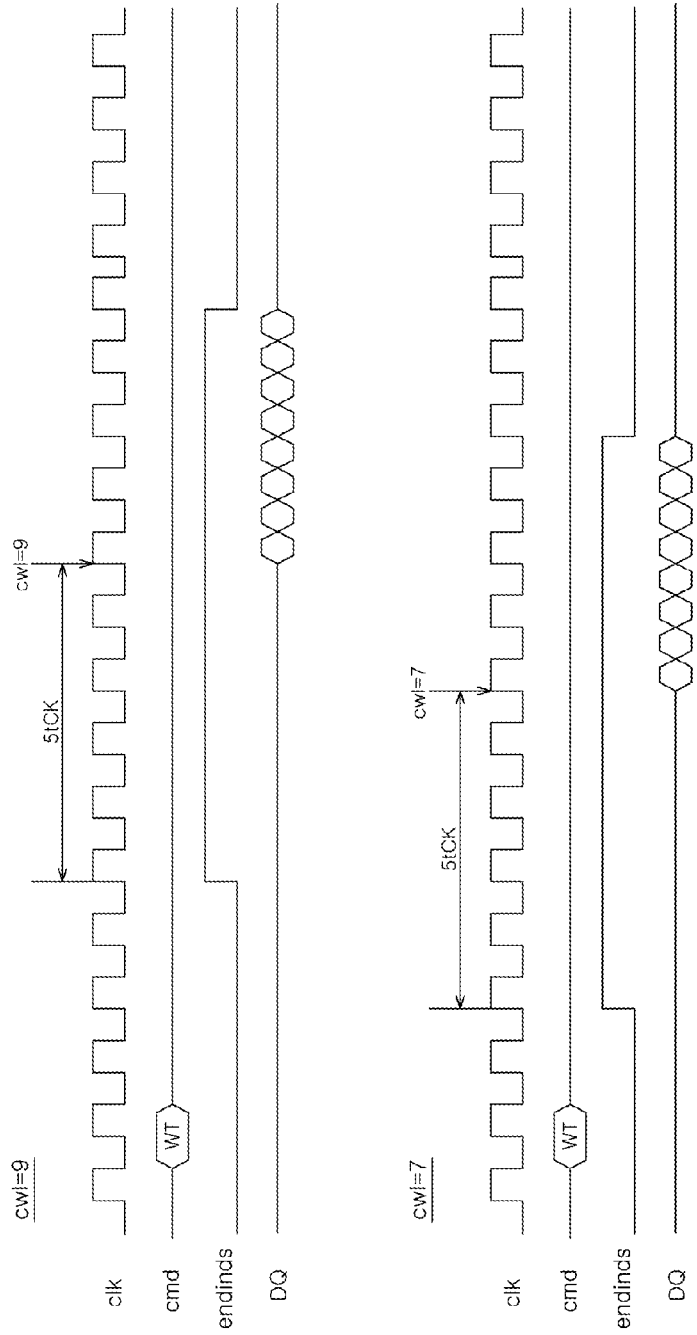
FIG. 1C is a timing diagram of a buffer control signal in the conventional buffer control circuit.

When comparing FIG. 1C and 7, it can be seen that the pulse width of the buffer control signal endinds is changed according to the command latency signals cwl<7:10>.

The pulse width of the buffer control signal endinds is lengthened when the first and second command latency signals cwl<9:10> are used than when the third and fourth command latency signals cwl<7:8> are used.

While various embodiments have been described above, it will be understood to those skilled in the art that the embodiments described are by way of example only. Accordingly, the buffer control circuit of a semiconductor memory apparatus described herein should not be limited based on the described embodiments.

What is claimed is:

1. A buffer control circuit of a semiconductor memory apparatus, comprising:
a delay unit configured to determine delay amounts for a command in response to a plurality of command latency signals, delay the command according to a clock, and generate a plurality of delayed signals; and
a buffer control signal generation unit configured to receive the plurality of command latency signals and the plurality of delayed signals, and generate a buffer control signal,
wherein the buffer control signal generation unit changes an pulse width of the buffer control signal by the period of the clock according to the command latency signals.

2. The buffer control circuit according to claim 1, wherein the buffer control signal generation unit selects an enable period of the buffer control signal according to a command latency signal selected among the plurality of command latency signals.

3. The buffer control circuit according to claim 1, wherein the delay unit generates the command as the plurality of delayed signals in response to a command latency signal selected among the plurality of command latency signals.

4. The buffer control circuit according to claim 1, wherein the delay unit comprises a plurality of multiplexers which determine the delay amounts for the command in response to the plurality of command latency signals.

5. The buffer control circuit according to claim 1, wherein the delay unit comprises a plurality of flip-flops which delay the command according to the clock and generate the plurality of delayed signals.

6. The buffer control circuit according to claim 1, wherein the delay unit comprises first to third delay elements which sequentially delay the command in response to the plurality of command latency signals.

7. The buffer control circuit according to claim 6, wherein the first to third delay elements delay the command in response to command latency signals selected among the plurality of command latency signals, and enable the plurality of delayed signals.

8. The buffer control circuit according to claim 7, wherein the plurality of command latency signals comprise first to fourth command latency signals.

9. The buffer control circuit according to claim 1, wherein the plurality of command latency signals comprise CAS write latency signals.

10. The buffer control circuit according to claim 1, further comprising:
a command decoder configured for decoding a command in response to the clock and outputting an internal command to the delay unit.

11. A buffer control circuit of a semiconductor memory apparatus, comprising:
a delay unit configured to determine delay amounts for a command in response to a plurality of command latency signals, delay the command according to a clock, and generate a plurality of delayed signals; and a buffer control signal generation unit configured to select an pulse width of a buffer control signal in response to the plurality of command latency signals, and generate the buffer control signal by combining the plurality of delayed signals, and output the buffer control signal, wherein the pulse width of the buffer control signal is changed by the period of the clock according to the plurality of command latency signals.

12. The buffer control circuit according to claim 11, wherein the buffer control signal generation unit comprises:

a buffer control signal period selecting section configured to select a delayed signal among the plurality of delayed signals in response to the command latency signals, and determine a period through which the buffer control signal is to be enabled; and a buffer control signal combining section configured to combine the selected delayed signal and the plurality of delayed signals and generate the buffer control signal.

13. The buffer control circuit according to claim 12, wherein the plurality of command latency signals comprise first to fourth command latency signals.

14. The buffer control circuit according to claim 11, wherein the delay unit enables the command as the plurality of delayed signals according to a command latency signal selected among the plurality of command latency signals.

15. The buffer control circuit according to claim 12, wherein the delay unit comprises a plurality of multiplexers which determine the delay amounts for the command in response to the plurality of command latency signals.

16. The buffer control circuit according to claim 12, wherein the delay unit comprises a plurality of flip-flops which delay the command according to the clock and generate the plurality of delayed signals.

17. The buffer control circuit according to claim 11, wherein the delay unit comprises first to third delay elements which sequentially delay the command in response to the plurality of command latency signals.

18. The buffer control circuit according to claim 17, wherein the first to third delay elements delay the command according to command latency signals selected among the plurality of command latency signals, and enable the plurality of delayed signals.

19. The buffer control circuit according to claim 11, wherein the plurality of command latency signals comprise CAS write latency signals.

20. The buffer control circuit according to claim 11, further comprising:

a command decoder configured for decoding a command in response to the clock and outputting an internal command to the delay unit.

* * * * *